(12) United States Patent
Lin et al.

(10) Patent No.: US 11,450,633 B2
(45) Date of Patent: Sep. 20, 2022

(54) PACKAGE STRUCTURE OF SEMICONDUCTOR DEVICE WITH IMPROVED BONDING BETWEEN THE SUBSTRATES

(71) Applicant: United Microelectronics Corp., Hsinchu (TW)

(72) Inventors: Ming-Tse Lin, Hsinchu (TW); Chung-Hsing Kuo, Taipei (TW); Hui-Ling Chen, Kaohsiung (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 16/781,937

(22) Filed: Feb. 4, 2020

(65) Prior Publication Data
US 2021/0202418 A1 Jul. 1, 2021

(30) Foreign Application Priority Data
Dec. 30, 2019 (TW) .................. 108148392

(51) Int. Cl.
*H01L 23/00* (2006.01)
(52) U.S. Cl.
CPC .................. *H01L 24/06* (2013.01)
(58) Field of Classification Search
CPC ......... H01L 24/08; H01L 24/06; H01L 24/09; H01L 21/4853; H01L 24/03; H01L 24/94; H01L 24/05; H01L 23/53295; H01L 23/5226; H01L 24/83; H01L 24/80; H01L 25/0657; H01L 23/585; H01L 25/50; H01L 29/0649; H01L 24/33; H01L 23/49811; H01L 24/16; H01L 24/13; H01L 23/49816; H01L 24/85; H01L 21/563; H01L 23/49838; H01L 24/81; H01L 21/6836
USPC ........................................... 257/773; 438/618
See application file for complete search history.

(56) References Cited

U.S. PATENT DOCUMENTS

| | | | |
|---|---|---|---|
| 8,293,578 B2 | 10/2012 | Bartley et al. | |
| 9,299,736 B2 | 3/2016 | Chen et al. | |
| 9,543,276 B2 | 1/2017 | Jee et al. | |
| 10,050,018 B2 | 8/2018 | Wu et al. | |
| 10,096,645 B2 | 10/2018 | Chen et al. | |
| 10,312,201 B1 | 6/2019 | Hu et al. | |
| 2001/0004135 A1* | 6/2001 | Okamura | H01L 23/528 257/778 |
| 2013/0001274 A1* | 1/2013 | Konno | H01L 21/4853 228/104 |

(Continued)

OTHER PUBLICATIONS

Lan Peng et al., "Cu—Cu Bond Quality Enhancement Through the Inclusion of a Hermetic Seal for 3-D IC", IEEE Transactions on Electron Devices, Apr. 1, 2013, pp. 1444-1450.

(Continued)

*Primary Examiner* — Didarul A Mazumder
(74) *Attorney, Agent, or Firm* — J.C. Patents

(57) ABSTRACT

A package structure of a semiconductor device includes a first substrate, a second substrate, and a bonding layer. The bonding layer bonds the first substrate and the second substrate. The bonding layer includes an inner bonding pad pattern and an outer bonding pad pattern formed in a dielectric layer. The outer bonding pad pattern surrounds the inner bonding pad pattern. A first bonding pad density of the outer bonding pad pattern is greater than a second bonding pad density of the inner bonding pad pattern.

10 Claims, 6 Drawing Sheets

(56) References Cited

U.S. PATENT DOCUMENTS

2013/0284885 A1   10/2013  Chen et al.
2018/0247915 A1*  8/2018  Kinsley ................... H01L 28/20
2019/0123006 A1*  4/2019  Chen ....................... H01L 24/08
2019/0164914 A1*  5/2019  Hu .......................... H01L 24/06

OTHER PUBLICATIONS

"Search Report of Europe Counterpart Application", dated Oct. 8, 2020, p. 1-p. 11.

* cited by examiner

PACKAGE STRUCTURE OF SEMICONDUCTOR DEVICE WITH IMPROVED BONDING BETWEEN THE SUBSTRATES

CROSS-REFERENCE TO RELATED APPLICATION

This application claims the priority benefit of Taiwan patent application Ser. No. 108148392, filed on Dec. 30, 2019. The entirety of the above-mentioned patent application is hereby incorporated by reference herein and made a part of this specification.

BACKGROUND

Technical Field

The disclosure relates to a semiconductor manufacturing technique, and more particularly, to a package structure of a semiconductor device.

Description of Related Art

Through semiconductor manufacturing technology, an integrated circuit can be manufactured on one substrate. The functions of the integrated circuit have been developed towards more complex designs in response to the overall development demands for electronic products. The number of components and interconnect structures included in an integrated circuit has thus increased significantly. There is a limit to the area of a substrate on which components can be formed and manufactured. Due to the large number of components involved for enhancing the function of the integrated circuit, the manufacturing of the integrated circuit, for example, has been developed towards stacking in the vertical direction of the substrate to form more components and circuits.

In further manufacturing and development, the integrated circuit may be divided into two parts which are respectively manufactured on the corresponding substrates. A bonding layer is formed at the upper layer of the substrate. The bonding layer includes a dielectric layer, and a plurality of bonding pads are disposed in the dielectric layer. The bonding pad is connected to a circuit formed on the substrate to bond to a circuit on another substrate. The positions of a plurality of bonding pads of the bonding layers of the two substrates are the same. In the subsequent packaging process, the two substrates face each other, and through bonding of the bonding layers, the whole integrated circuit can be formed.

In the above packaging process, if the bonding strength between the two substrates is insufficient, when the circuit is subsequently cut into a single die, the bonding pads may have poor contact or even separate due to the insufficient bonding strength, which may cause manufacturing failure of the integrated circuit and lower the yield. Therefore, the bonding strength between the two substrates needs to be enhanced to at least reduce damage to the circuit in the subsequent die cutting process.

SUMMARY

The invention provides a layout of a bonding pad pattern on a substrate, which can improve the bonding of bonding layers and reduce the phenomenon of separation of the bonding layers between two substrates.

In an embodiment, the invention provides a package structure of a semiconductor device, including a first substrate, a second substrate, and a bonding layer. The bonding layer bonds the first substrate and the second substrate. The bonding layer includes an inner bonding pad pattern and an outer bonding pad pattern formed in a dielectric layer, and the outer bonding pad pattern surrounds the inner bonding pad pattern. A first bonding pad density of the outer bonding pad pattern is greater than a second bonding pad density of the inner bonding pad pattern.

In an embodiment, in the package structure of a semiconductor device, there is a first distance between two adjacent bonding pads in the outer bonding pad pattern at the first bonding pad density, there is a second distance between two adjacent bonding pads in the inner bonding pad pattern at the second bonding pad density, and the first distance is smaller than the second distance.

In an embodiment, in the package structure of a semiconductor device, the first substrate includes a first bonding layer, the second substrate includes a second bonding layer, and the first bonding layer and the second bonding layer are bonded together to form the bonding layer.

In an embodiment, in the package structure of a semiconductor device, the outer bonding pad pattern is a dummy pattern, and the inner bonding pad pattern is connected between a circuit in the first substrate and a circuit in the second substrate.

In an embodiment, in the package structure of a semiconductor device, a plurality of bonding pads of the inner bonding pad pattern are uniformly distributed in a square region, a rectangular region, or a circular region.

In an embodiment, in the package structure of a semiconductor device, a plurality of bonding pads of the outer bonding pad pattern are distributed to form at least one pad ring surrounding the inner bonding pad pattern.

In an embodiment, in the package structure of a semiconductor device, a plurality of bonding pads of the outer bonding pad pattern include a plurality of pad rings surrounding the inner bonding pad pattern.

In an embodiment, in the package structure of a semiconductor device, the plurality of bonding pads of the plurality of pad rings are aligned in a horizontal direction or a vertical direction.

In an embodiment, in the package structure of a semiconductor device, the plurality of bonding pads of the plurality of pad rings are alternately shifted in a horizontal direction or a vertical direction.

In an embodiment, in the package structure of a semiconductor device, a plurality of bonding pads of the outer bonding pad pattern are distributed to form one pad ring.

In an embodiment, in the package structure of a semiconductor device, the outer bonding pad pattern is a right-angle quadrilateral, and each side of the right-angle quadrilateral includes a plurality of bonding pad rows along the side.

In an embodiment, in the package structure of a semiconductor device, a distribution of a plurality of bonding pads in each of the bonding pad rows is the same.

In an embodiment, in the package structure of a semiconductor device, a distribution of a plurality of bonding pads in each of the bonding pad rows is different between two adjacent bonding pad rows.

In an embodiment, in the package structure of a semiconductor device, a plurality of bonding pads of the outer bonding pad pattern are distributed to form at least two pad rings. A pad distribution of an inner ring of the at least two pad rings includes discontinuous regions at corners of the right-angle quadrilateral.

In an embodiment, in the package structure of a semiconductor device, a plurality of bonding pads of the at least two pad rings are distributed to form at least two bonding pad rows on each side of the right-angle quadrilateral, and a length of each of the at least two bonding pad rows is equal to a length of the corresponding side.

BRIEF DESCRIPTION OF THE DRAWINGS

The accompanying drawings are included to provide a further understanding of the invention, and are incorporated in and constitute a part of this specification. The drawings illustrate embodiments of the invention and together with the description serve to explain the principles of the invention.

DESCRIPTION OF THE EMBODIMENTS

The invention relates to a semiconductor packaging technique. By planning the bonding pad pattern on the substrate, the invention can improve the bonding degree of a bonding layer between two substrates. The invention can reduce, for example, the phenomenon of separation of the bonding layer between two substrates when cutting a die.

Some embodiments will be described below to illustrate the invention, but the invention is not limited to the multiple embodiments provided. It is also possible that the multiple embodiments provided can be combined with each other.

There are various bonding techniques available for bonding between substrates, e.g., a dielectric-to-dielectric bonding technique. The mechanism of dielectric-to-dielectric bonding involves performing bonding at a relatively low temperature or causing chemical reaction, between one dielectric layer and another dielectric layer to bond the dielectric materials. The bonding pads between the dielectric layers are in contact to achieve electrical connection.

Afterwards, an annealing process at a higher temperature is performed to enhance the bonding strength, and the bonding degree between the bonding pads will further achieve excellent bonding.

Figure 1A:
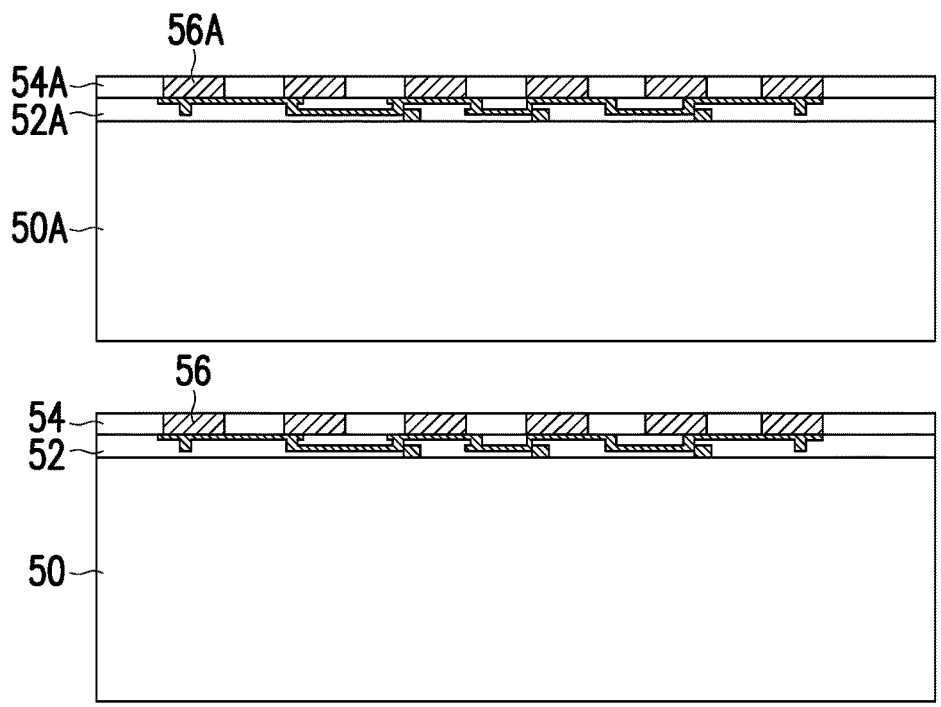
FIG. 1A to FIG. 1C are schematic views showing a mechanism of bonding two substrates.
Figure 1B:
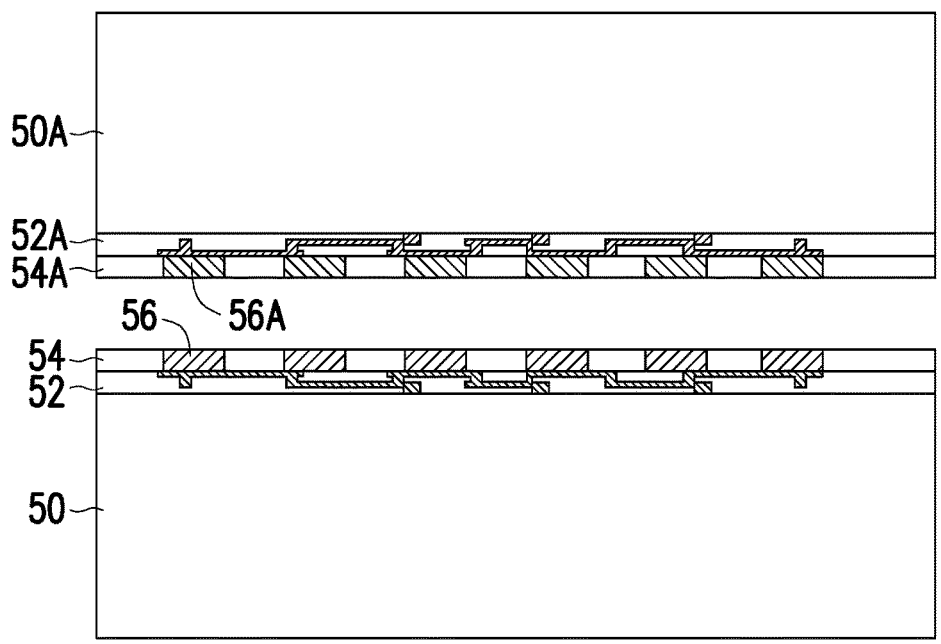
Figure 1C:
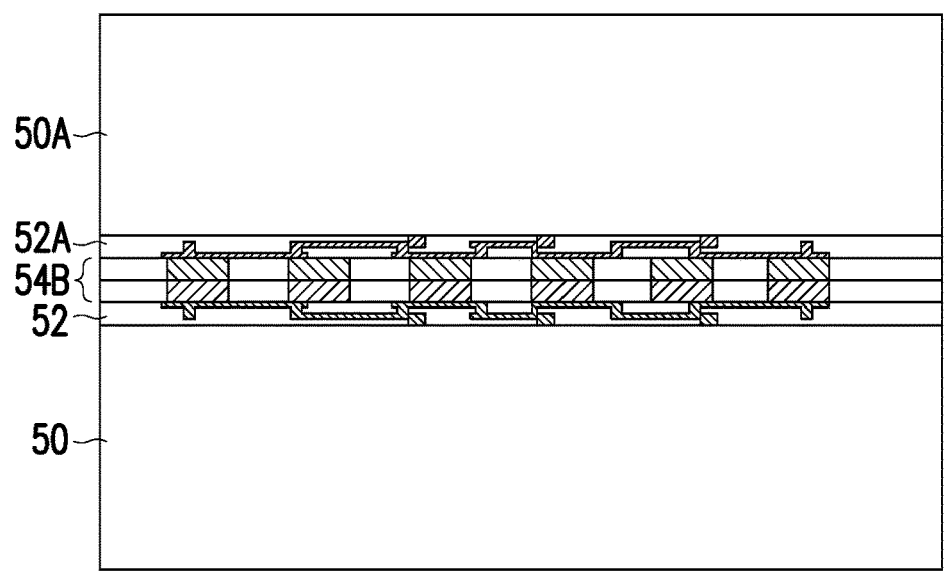

FIG. 1A to FIG. 1C are schematic views showing a mechanism of bonding two substrates. Referring to FIG. 1A, predetermined circuit structures are completed respectively in two substrates 50 and 50A. For example, interconnect layers 52 and 52A may be formed respectively at the upper ends of the substrates 50 and 50A and may also be, for example, redistribution layers (RDL) which can more uniformly redistribute the connection endpoints. Accordingly, the endpoints to be electrically connected between the two interconnect layers 52 and 52A are disposed at the same position, so that the two circuits on the two substrates 50 and 50A are connected into a whole circuit. With respect to the endpoints to be connected, a plurality of bonding pads 56 and 56A corresponding to the endpoints to be connected are formed through bonding layers 54 and 54A. The material of the bonding layers 54 and 54A includes a dielectric layer, and the plurality of bonding pads 56 and 56A are respectively formed in the same pattern in the bonding layers 54 and 54A of the two substrates 50 and 50A. The bonding pads 56 and 56A are, for example, copper, a selected metal, or a conductive material. The bonding pads 56 and 56A of the invention are not limited to specific materials. The circuit structures on the two substrates 50 and 50A are manufactured separately.

Referring to FIG. 1B, the bonding layers 54 and 54A of the two substrate 50 and 50A are aligned with each other, and then the first-stage dielectric material bonding is performed, for example, by causing a chemical reaction between the dielectric materials at a relatively low temperature to bond the dielectric materials. The corresponding bonding pads 56 and 56A which belong to the two substrates 50 and 50A will be in contact and connected. The dielectric material is generally, for example, silicon oxide but is not limited thereto. The dielectric material may also be, for example, silicon oxynitride, silicon nitride, or a similar material.

Referring to FIG. 1C, after the bonding layers 54 and 54A of the two substrates 50 and 50A undergo the first-stage bonding, annealing at a higher temperature is performed to obtain a bonding layer 54B. The effect of annealing further enhances the bonding strength between the dielectric materials and also promotes better bonding of the bonding pads 56 and 56A.

Figure 2:
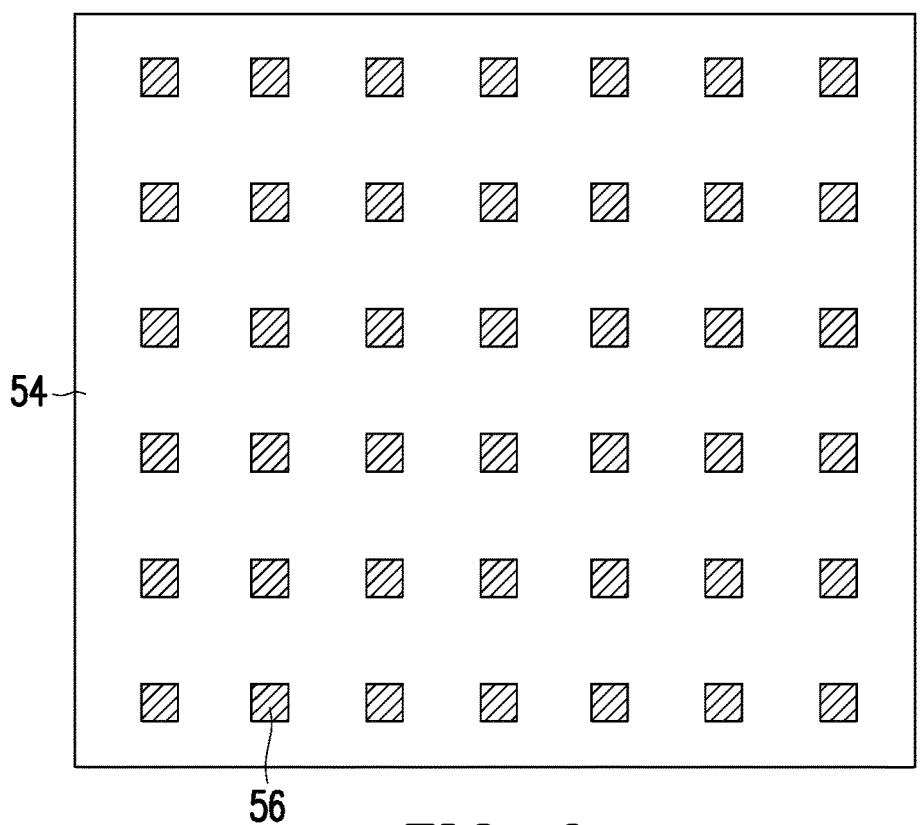
FIG. 2 is a schematic view showing a bonding pad pattern on a substrate.

FIG. 2 is a schematic view showing a bonding pad pattern on a substrate. Taking the bonding layer on the substrate 50 as an example, it is observed herein that the density of the plurality of bonding pads 56 in the bonding layer 54 is still relatively low (sparse distribution) even after the re-layout through the interconnect layer 52. This is because the number of endpoints to be actually connected between the two circuits is not large. Here, one endpoint may be configured with a plurality of bonding pads 56, but the density is still relatively low, which may cause the bonding strength between the two substrates to be insufficient and result in separation of the two substrates when cutting the die. The invention at least looks into the issue of the bonding pads 56 in the bonding layer 54 and proposes a layout for the bonding pads in the bonding layer 54.

FIG. 3 to FIG. 6 are schematic views showing bonding pad patterns on a substrate according to multiple embodiments of the invention.

Figure 3:
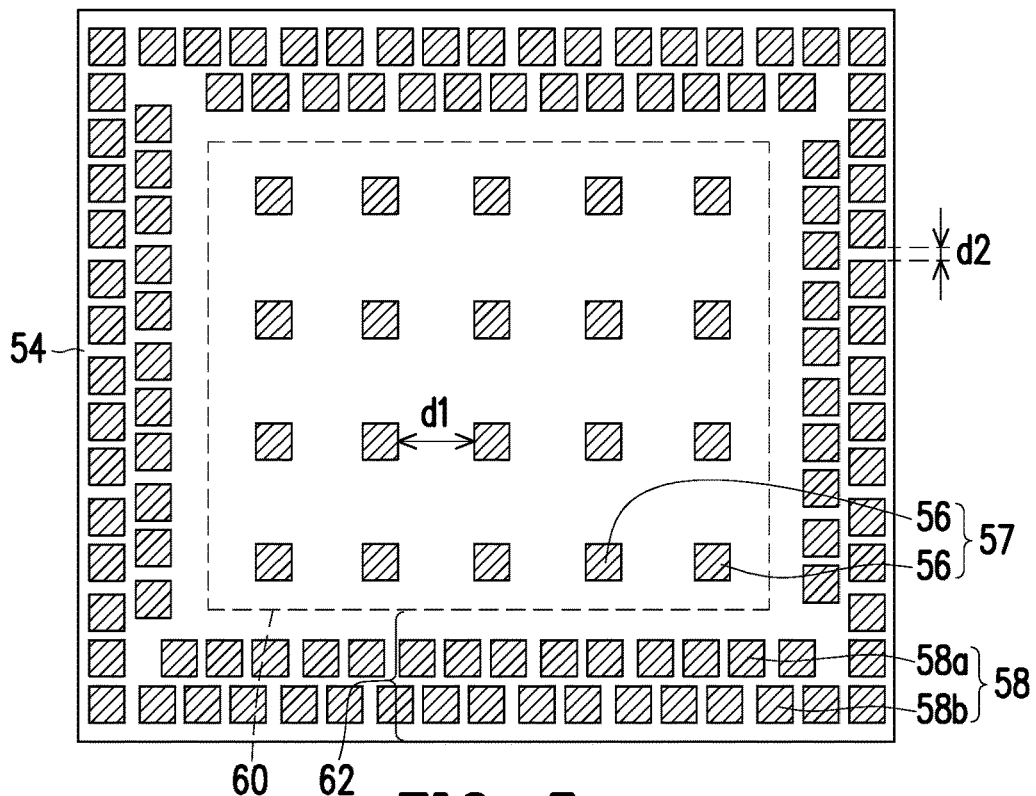
FIG. 3 to FIG. 6 are schematic views showing bonding pad patterns on a substrate according to multiple embodiments of the invention.

Referring to FIG. 3, the bonding layer 54 of the substrate 50 will be taken as an example to describe the layout of the bonding pad pattern. The bonding pad pattern of the bonding layer 54A on the substrate 50A is the same as the bonding pad pattern of the bonding layer 54 on the substrate 50, and they are bonded, for example, through the bonding process of FIG. 1A to FIG. 1C to achieve the overall connection of the two circuits.

In an embodiment, the bonding layer 54 includes an inner region 60 and an outer region 62. The outer region 62 surrounds the inner region 60. The geometry of the inner region 60 is, for example, a rectangle or a square but is not limited thereto. The geometry of the inner region 60 may also be a circle or other shapes. A rectangle or a square will be taken as an example in the description below.

A plurality of bonding pads 56 are disposed in the inner region 60, and they are uniformly distributed to form an inner bonding pad pattern 57. A plurality of bonding pads 58a and 58b are disposed in the outer region 62 to form an outer bonding pad pattern 58. The bonding layer 54 includes a dielectric layer which surrounds the inner bonding pads 56 and the outer bonding pads 58a and 58b. The inner bonding pad pattern 57 is configured for actual bonding of circuits. The outer bonding pad pattern 58 is formed of dummy bonding pads 58a and 58b located in the outer region 62 of the bonding layer 54 and may enhance the bonding strength after bonding.

When cutting a die, the external force of cutting will be applied along a scribe line, and the edge of the bonding layer 54 will be subjected to the cutting force and is likely to be damaged. The dummy outer bonding pad pattern 58 may withstand the cutting force. Accordingly, the bonding pad density of the outer bonding pad pattern 58 should be greater than the bonding pad density of the inner bonding pad pattern 57.

Regarding the magnitude of the bonding pad density, in an embodiment, there is a distance d2 between two adjacent bonding pads in the outer bonding pad pattern 58 at a predetermined first bonding pad density. There is a distance d1 between two adjacent bonding pads in the inner bonding pad pattern 57 at a predetermined second bonding pad density. The high-density distance d2 is smaller than the low-density distance d1. Because the bonding pads 58a and 58b of the outer bonding pad pattern 58 have a large bonding pad density, their mechanical strength and bonding strength are larger, and they can withstand the external cutting force, so that the two bonding layers 54 and 54A are less likely to be separated.

The distribution of the plurality of bonding pads 56 of the inner bonding pad pattern 57 may be laid out according to the actual requirements of circuit bonding. The plurality of bonding pads 58a and 58b of the outer bonding pad pattern 58 are laid out at a greater density. In an embodiment, the plurality of bonding pads 58a and 58b of the outer bonding pad pattern 58 are, for example, two pad rings. The bonding pads 58a form an inner pad ring, and the bonding pads 58b form an outer pad ring. Based on the geometry of the inner region 60, the inner pad ring or outer pad ring formed of the bonding pads may be continuous or may also include discontinuous local regions. For example, the inner pad ring may have discontinuous local regions at the corners. In addition, the bonding pads 58a of the inner pad ring and the bonding pads 58b of the outer pad ring may be laid out to be alternately shifted. In a vertical direction, e.g., a direction of the wide side of the rectangle, the bonding pads 58a and the bonding pads 58b are left-right staggered. Similarly, in a horizontal direction, e.g., a direction of the long side of the rectangle, the bonding pads 58a and the bonding pads 58b are up-down staggered. Accordingly, the bonding pads 58a of the inner pad ring can block the stress passed between the bonding pads 58b of the outer pad ring. In an embodiment, the plurality of bonding pads 58a and 58b of the outer bonding pad pattern 58 do not need to be aligned with the extending direction of the plurality of bonding pads 56 of the inner bonding pad pattern 57. However, the invention is not limited to the layout of the plurality of bonding pads 58a and 58b of the outer bonding pad pattern 58 in FIG. 3.

Figure 4:
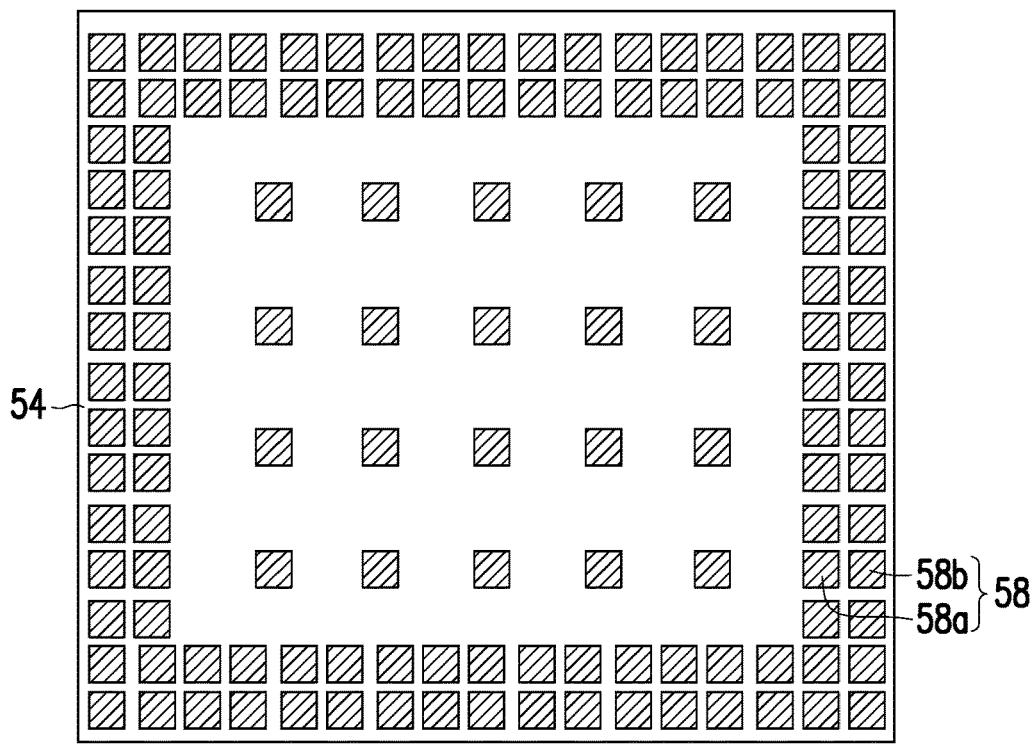

Referring to FIG. 4, in an embodiment, the bonding pads 58a of the inner pad ring and the bonding pads 58b of the outer pad ring formed of the plurality of bonding pads 58a and 58b of the outer bonding pad pattern 58 may also be aligned with each other.

Figure 4A:
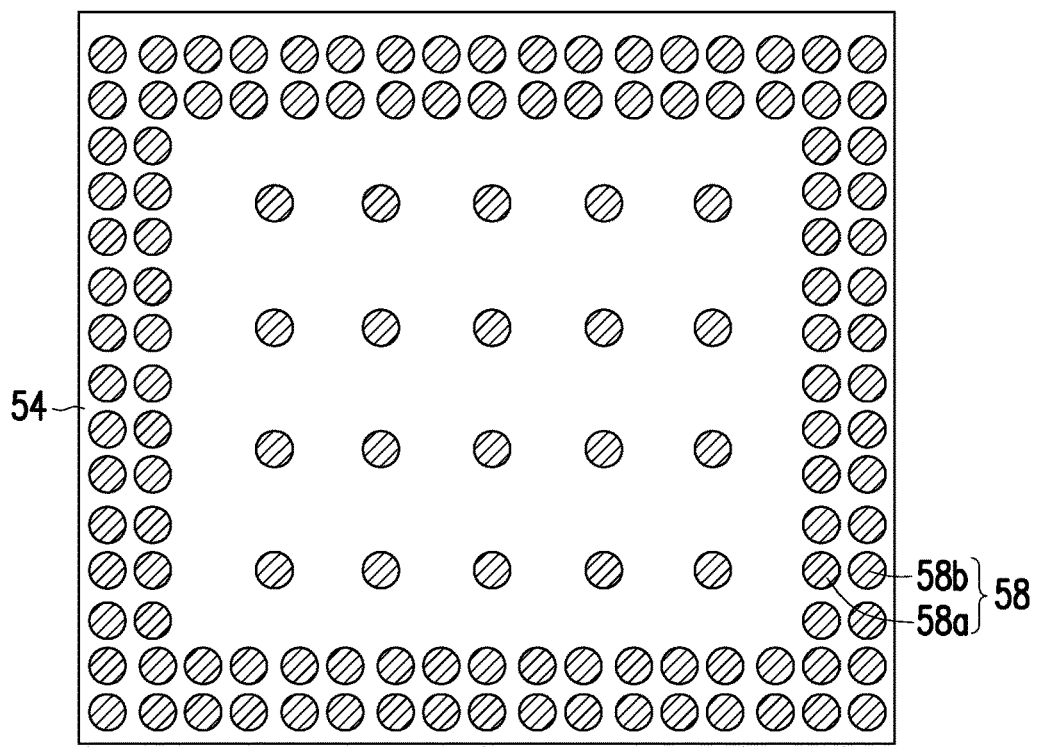
Figure 4B:
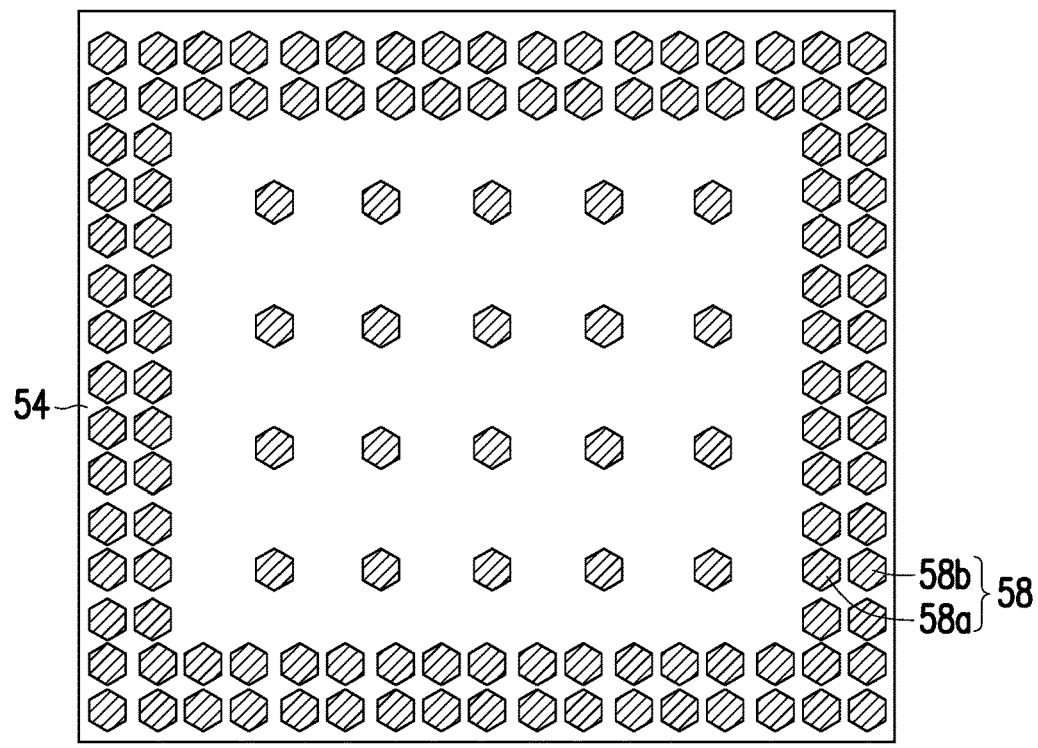

In an embodiment, on the wide side and the long side of the rectangle, a plurality of rows of bonding pads 58a and 58b may be stacked. For example, two rows of bonding pads 58a and 58b may be stacked. However, as will be described below, the invention is not limited to this layout. The layout of the bonding pads 58a and 58b of FIG. 4 is only an example provided for illustration. In an embodiment, the bonding pads 58a and 58b at the corners may not be provided. The geometry of the bonding pads 58a and 58b may be, for example, a rectangle, a polygon, or a circle and is not limited to a square. In an embodiment, for example, in FIG. 4A, the geometry of the bonding pads 58a and 58b is a circle. In an embodiment, for example, in FIG. 4B, the geometry of the bonding pads 58a and 58b is a hexagon.

Figure 5:
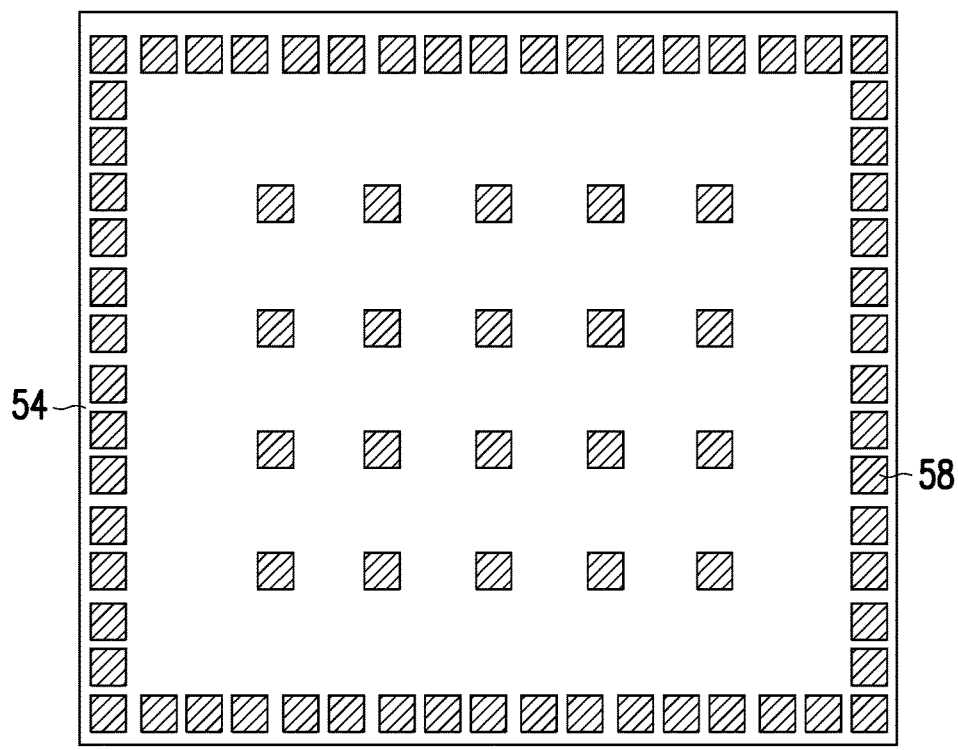

In an embodiment, referring to FIG. 5, the plurality of bonding pads of the outer bonding pad pattern 58 may also be laid out to be, for example, a single pad ring, which can similarly enhance the bonding strength at the periphery, and the invention is not limited to the layout of two pad rings in FIG. 3 and FIG. 4.

Figure 6:
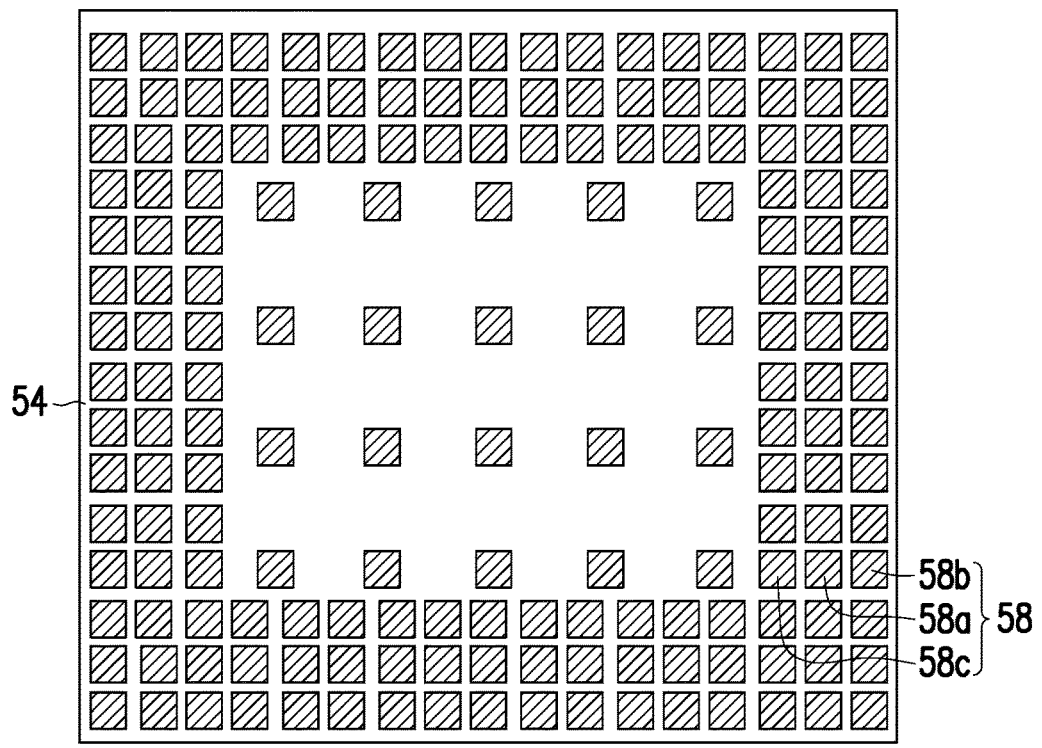

In an embodiment, referring to FIG. 6, the plurality of bonding pads of the outer bonding pad pattern 58 may also be laid out to be, for example, multiple pad rings such as three rings, and the invention is not limited to the layout of two rings of FIG. 3 and FIG. 4. The bonding pads 58a, 58b, and 58c of the three pad rings further include a pad ring of the bonding pad 58c based on the layout of the two pad rings shown in FIG. 3 or FIG. 4.

In other words, the layout of the bonding pads of the outer bonding pad pattern 58 may be changed according to the actual requirements, and a greater bonding pad density can enhance the mechanical strength and bonding strength in the peripheral region and reduce the separation of the two substrates during cutting.

Figure 7:
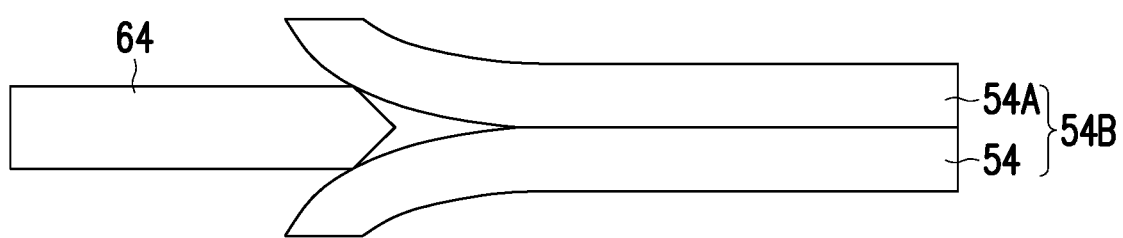
FIG. 7 is a schematic view showing inspection of a bonding quality of bonding layers according to multiple embodiments of the invention.

FIG. 7 is a schematic view showing inspection of a bonding quality of bonding layers according to multiple embodiments of the invention. Referring to FIG. 7, herein, the bonding strength between the two bonding layers 54 and 54A of the bonding layer 54B is tested. For example, a knife tool 64 is used to change the applied external force, and the magnitude of the applied force for peeling the two bonding layers 54 and 54A is observed to determine the magnitude of the bonding strength. According to the test data, when the density of the periphery increases, the stress for causing peeling also increases, at an increase rate greater than the linear one-order increase rate. In other words, the arrangement of the outer bonding pad pattern 58 of the invention can effectively prevent peeling of the two bonding layers 54 and 54A.

Lastly, it is noted that the above embodiments are only provided to describe, rather than limit, the technical solutions of the invention. Although the invention has been described in detail with reference to the foregoing embodiments, one of ordinary skill in the art will understand that he or she can still modify the technical solutions described in the foregoing embodiments, or make equivalent replacements to some or all of the technical features. These modifications or replacements do not cause the nature of the corresponding technical solutions to depart from the scope of the technical solutions of the embodiments of the invention.

What is claimed is:
1. A package structure of a semiconductor device, comprising:
 a first substrate;
 a second substrate; and
 a bonding layer bonding the first substrate and the second substrate, wherein the bonding layer comprises an inner bonding pad pattern and an outer bonding pad pattern formed in a dielectric layer, and the outer bonding pad pattern surrounds the inner bonding pad pattern, wherein the outer bonding pad pattern is a dummy pattern, and the inner bonding pad pattern is connected between a circuit in the first substrate and a circuit in the second substrate, wherein the inner bonding pad pattern comprises a plurality of first bonding pads arranged with a pitch between two adjacent first bonding pads in a vertical direction and a horizontal direction, the outer bonding pad pattern comprises a plurality of second bonding pads, and each of the first bonding pads has the same size as each of the second bonding pads, and a density of the second bonding pads of the outer bonding pad pattern is greater than a density of the first bonding pads of the inner bonding pad pattern, and a vertical pitch between two of the first bonding pads of the inner bonding pad pattern is greater than a vertical pitch between two of the second bonding pads of the outer bonding pad pattern, the second bonding pads of the outer bonding pad pattern are distributed to form a plurality of pad rings surrounding the inner bonding pad pattern, and the second bonding pads of the plurality of pad rings are alternately shifted in the horizontal direction or the vertical direction.

2. The package structure of a semiconductor device according to claim 1, wherein a first distance between the two adjacent second bonding pads in the outer bonding pad pattern at the first bonding pad density, a second distance between the two adjacent first bonding pads in the inner bonding pad pattern at the second bonding pad density, wherein the first distance is smaller than the second distance.

3. The package structure of a semiconductor device according to claim 1, wherein the first substrate comprises a first bonding layer, the second substrate comprises a second bonding layer, and the first bonding layer and the second bonding layer are bonded together to form the bonding layer.

4. The package structure of a semiconductor device according to claim 1, wherein the first bonding pads of the inner bonding pad pattern are uniformly distributed in a square region, a rectangular region, or a circular region.

5. The package structure of a semiconductor device according to claim 1, wherein the outer bonding pad pattern is a right-angle quadrilateral, and each side of the right-angle quadrilateral comprises a plurality of bonding pad rows along the side.

6. The package structure of a semiconductor device according to claim 5, wherein a distribution of the second bonding pads in each of the bonding pad rows is the same.

7. The package structure of a semiconductor device according to claim 5, wherein a distribution of the second bonding pads in each of the bonding pad rows is different between two adjacent bonding pad rows.

8. The package structure of a semiconductor device according to claim 5, wherein the second bonding pads of the outer bonding pad pattern are distributed to form at least two pad rings, wherein a pad distribution of an inner ring of the at least two pad rings comprises discontinuous regions at corners of the right-angle quadrilateral.

9. The package structure of a semiconductor device according to claim 8, wherein the second bonding pads of the at least two pad rings is distributed to form at least two bonding pad rows on each side of the right-angle quadrilateral, and a length of each of the at least two bonding pad rows is equal to a length of the corresponding side.

10. The package structure of a semiconductor device according to claim 1, wherein a geometric shape of the first bonding pads comprises circle, square, rectangle, hexagon, or polygon, and a geometric shape of the second bonding pads comprises circle, square, rectangle, hexagon, or polygon.

* * * * *